US006876836B2

(12) United States Patent  (10) Patent No.: US 6,876,836 B2
Lin et al.                  (45) Date of Patent:    Apr. 5, 2005

(54) LAYOUT OF WIRELESS COMMUNICATION CIRCUIT ON A PRINTED CIRCUIT BOARD

(75) Inventors: Tsung-Liang Lin, Hsinchu (TW); Tsung-Lu Tsai, Hsinchu (TW); Jan-Kwo Leeng, Hsinchu (TW)

(73) Assignee: Integrated Programmable Communications, Inc., Palo Alto, CA (US)

( * ) Notice: Subject to any disclaimer, the term of this patent is extended or adjusted under 35 U.S.C. 154(b) by 434 days.

(21) Appl. No.: 10/064,535

(22) Filed: Jul. 25, 2002

(65) Prior Publication Data

US 2004/0018814 A1 Jan. 29, 2004

(51) Int. Cl.⁷ .................................................. H04B 1/38
(52) U.S. Cl. ........................................................ 455/73
(58) Field of Search ........................ 455/73, 90.2, 90.3; 379/429

(56) References Cited

U.S. PATENT DOCUMENTS 6,628,925 B1 * 9/2003 Ishida et al. .................. 455/73

\* cited by examiner

*Primary Examiner*—Jack Chiang
(74) *Attorney, Agent, or Firm*—Jiang Chyun IP Office

(57) ABSTRACT

A layout of a wireless communication circuit on a printed circuit board (PCB), which is a rectangular board wherein a first side is a Y-axis and a second side is an X-axis. The layout has a first antenna located at a corner between the first side and the second side. An antenna switch and a first filter are located at middle y-coordinate and a X-coordinate. A RF integrated circuit (RFIC) is located after the first filter. A first regulator is located near the second side and higher than the RFIC. A media access control (MAC) is located at about a middle y-coordinate and higher than the first regulator. An oscillator is located at a corner between the second side and the third side. A second regulator is located near the fourth side and above the first regulator. A power amplifier is located near the fourth side above the RFIC. A second filter and a transmitting/receiving (T/R) switch are located before the power amplifier. A second antenna is located at a corner between the first side and the fourth side.

5 Claims, 4 Drawing Sheets

LAYOUT OF WIRELESS COMMUNICATION CIRCUIT ON A PRINTED CIRCUIT BOARD

BACKGROUND OF INVENTION

1. Field of Invention

The present invention relates to wireless communication technology. More particularly, the present invention relates to a layout of a wireless communication circuit architecture on a printed circuit board (PCB), suitable for use as pPC-card for operating in the industrial, scientific and medical (ISM) band at 2.4 GHz.

2. Description of Related Art

In the last several decades, progress in radio and Very Large Scale Integrated circuit (VLSI) technology has fostered widespread use of radio communications in consumer applications. Portable devices, such as mobile radiotelephones, can now be produced having acceptable cost, size and power consumption.

Although wireless technology is today focused mainly on voice communications (e.g., with respect to handheld radios), this field will likely expand in the near future provide greater information flow to and from other types of nomadic devices and fixed devices. More specifically, it is likely that further advances in technology will provide very inexpensive radio equipment which can be easily integrated into many devices. This will reduce the number of cables currently used for many applications. For example, radio communication can eliminate or reduce the number of cables used to connect master devices with their respective peripherals.

The aforementioned radio communications will require an unlicensed band with sufficient capacity to allow for high data rate transmissions. A suitable band is the so-called Industrial, Scientific and Medical (ISM) band at 2.4 GHz, which is globally available. The ISM band provides 83.5 MHz of radio spectrum.

To allow different radio networks to share the same radio medium without coordination, signal spreading is usually applied. In fact, the Federal Communications Commission (FCC) in the United States currently requires radio equipment operating in the 2.4 GHz band to apply some form of spectrum spreading technique when the transmit power exceeds about 0 dBm. Spread spectrum communication techniques, which have been around since the days of World War II, are of interest in today's commercial applications because they provide robustness against interference, which allows for multiple signals to occupy the same bandwidth at the same time.

The use of cellular communication systems having mobile devices which communicate with a hardwired network, such as a local area network (LAN) or a wide area network (WAN), has become widespread. Retail stores and warehouse, for example, may use cellular communications systems with mobile data terminals to track inventory and replenish stock. The transportation industry may use such systems at large outdoor storage facilities to keep an accurate account of incoming and outgoing shipments. In manufacturing facilities, such systems are useful for tracking parts, completed products and defects. Such systems are also utilized for cellular telephone communications to allow users with wireless telephones to roam across large geographical regions while retaining telephonic access. Paging networks also may utilize cellular communications systems which enable a user carrying a pocket sized pager to be paged anywhere within a geographic region.

In order to manage the wireless communication with multiple nodes, the IEEE 802.11b protocol is proposed to govern the signal transmission and reception. Also and, since the computer industry is well developed, the wireless LAN (WLAN) has been allowed to be adapted in the computer system, such as person computer. For the application of IEEE 802.11b WLAN PC-CARD, traditional RF architecture of super-heterodyne is commonly adapted, which needs two voltage controlled oscillators (VCO), two mixers, and a surface acoustic wave (SAW) filter.

In order to reduce the fabrication cost, some elements are reduced. FIG. 1 is a block diagram, schematically illustrating the conventional wireless communication circuit architecture. From the circuit architecture in FIG. 1, the communication system at the local user"s system usually needs two antennas 100, 102 for diversity. During the receiving operation mode, one of the antennas 100, 102 with better quality can be selected for receiving the RF signals. However, one of the antennas 100, 102 can be set to be always used for transmission. The antennas 100, 102 are coupled to an antenna switch 104, which is used to select the desired antenna. The output of the antenna switch 104 is coupled to a band pass filter (BPF) 106. The BPF 106 allows the signal with specific frequency to pass. Particularly, the digital I/Q signal uses a specific frequency for transmission. Since the BPF 106 is commonly used for receiving mode and transmitting mode, the BPF 106 is coupled to transmission/receiving (T/R) switch 108. The T/R switch 108 has two output terminals one or for the receiving path and another one is for transmitting path. For the receiving path, the output signal from the BPF 106 is selected by the T/R switch 108 and sent to a RF integrated circuit (RFIC) 110. The RFIC 110 is used to convert the RF signal into the signal format capable of being processed, for example, in the local computer requested by the user. When a transmission mode is employed, the RFIC 110 sends the signal to a power amplifier 112. After being amplified, the signal is sent to a filter unit 114, which is composed by the BPF and the low pass filter (LPF). Then, the output of the BPF/LPF 114 is selected by the (T/R) switch 108 for transmitting. The signal then follows the same path for transmitting the RF signal.

In the foregoing conventional circuit architecture as shown in FIG. 1, the BPF 106 is typically necessary because the RFIC 110 usually includes a low noise amplifier (LNA), which needs the BPF 106 to filter away the noise. Also and, usually the RFIC 100 includes addition voltage controlled oscillator (VCO) (not shown) to reduce the frequency from high to low for internal circuit or other uses. Conventionally, it includes two VCO"s at lower frequencies. The VCO frequency should be filtered away. Therefore, the BPF/LPF 114 usually needs at least one BPF. When considering the whole range of the frequency, the LPF may also be included. Then, in the conventional design, the antennas 100, 102, the antenna switch 104 and the BPF 106 are commonly used in the transmitting path and the receiving path. From these considerations, the conventional wireless communication circuit architecture is designed as shown in FIG. 1.

From the performance point of view, since the transmitted signals will inevitably attenuates along with the transmitting distance, the transmission range in wireless communication is strongly concerned. The transmission range is then depending on the transmitting power. According to the convention design in FIG. 1, the insertion power loss for each elements are following. The antenna switch 104 consumes about 0.5 dB, the BPF 106 consumes about 2.0 dB, the T/R switch 108 also consumes 0.5 dB, and the BPF/LPF 114 at least also consumes about 2.0 dB, in which the LPF usually consume about 0.8 dB. In this design, the transmitting path needs two BPF"s to filter the signals. And, the BPF has larger power loss. In this design, the insertion loss is still not sufficient low. The skilled artisans may still intend to reduce insertion loss, so as to increase the transmission rage in wireless communication. How to improve the transmission range without consuming too much power is the issue to be solve or improved by the skilled artisans.

SUMMARY OF INVENTION

The invention provides a wireless communication circuit architecture, which can significantly reduce the insertion power loss. As a result, the transmission range is effectively improved. This is very helpful in wireless communication. The invention provides a wireless communication circuit architecture, in which the transmitting path is significantly simplified, so as to reduce the insertion loss. Also and, the fabrication cost is also reduced.

The invention provide a layout on a printed circuit board wireless communication circuit architecture with reduced electromagnetic interference, so as to ensure the circuit to have the optimized performance.

As embodied and broadly described herein, the invention provides a layout of a wireless communication circuit on a printed circuit board (PCB), which is a rectangular board having a first side, a second side, a third side, and a fourth side in counterclockwise. The first and the third sides are shorter than the second and the fourth sides, the first side is a Y-axis and the second side is an X-axis. The layout comprises a first antenna, located at a corner between the first side and the second side. An antenna switch is coupled with the first antenna, and located at about a middle y-coordinate and a first x-coordinate. A first filter is coupled with the antenna switch, located under the antenna switch at a smaller y-coordinate. A RF integrated circuit (RFIC) is coupled with the first filter, and located at a larger x-coordinate than the first filter, wherein a sensitive input/output side of the RFIC is toward the second side of the PCB. A first regulator is located near the second side of the PCB and at a higher X-coordinate than the RFIC. A baseband/media-access-control (BB/MAC) is coupled with the RFIC, and located at about a middle y-coordinate and a higher x-coordinate than the first regulator. A global oscillator is located about a corner between the second side and the third side. A plurality of signal pins are distributed along the third side of the PCB. A second regulator is located near the fourth side and having about the same x-coordinate of the first regulator. A power amplifier is coupled to the RFIC, and located near the fourth side and about with the same x-coordinate of the RFIC, wherein the distance between the power amplifier and the RFIC is set to have sufficient value. A second filter is coupled to the power amplifier, and located at a smaller x-coordinate and near the fourth side. A transmitting/receiving (T/R) switch is coupled to the second filter, and located at a lower y-coordinate than the second filter and about the same x-coordinate. A second antenna is coupled to the T/R switch, located at a corner between the first side and the fourth side.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention has considered the conventional issues and has introduced a novel wireless communication circuit architecture. The invention at least can reduce the insertion loss for the transmitting path. As a result, the transmission range can be effectively increased. An example is provided as an example for describing the features of the invention.

Figure 2:
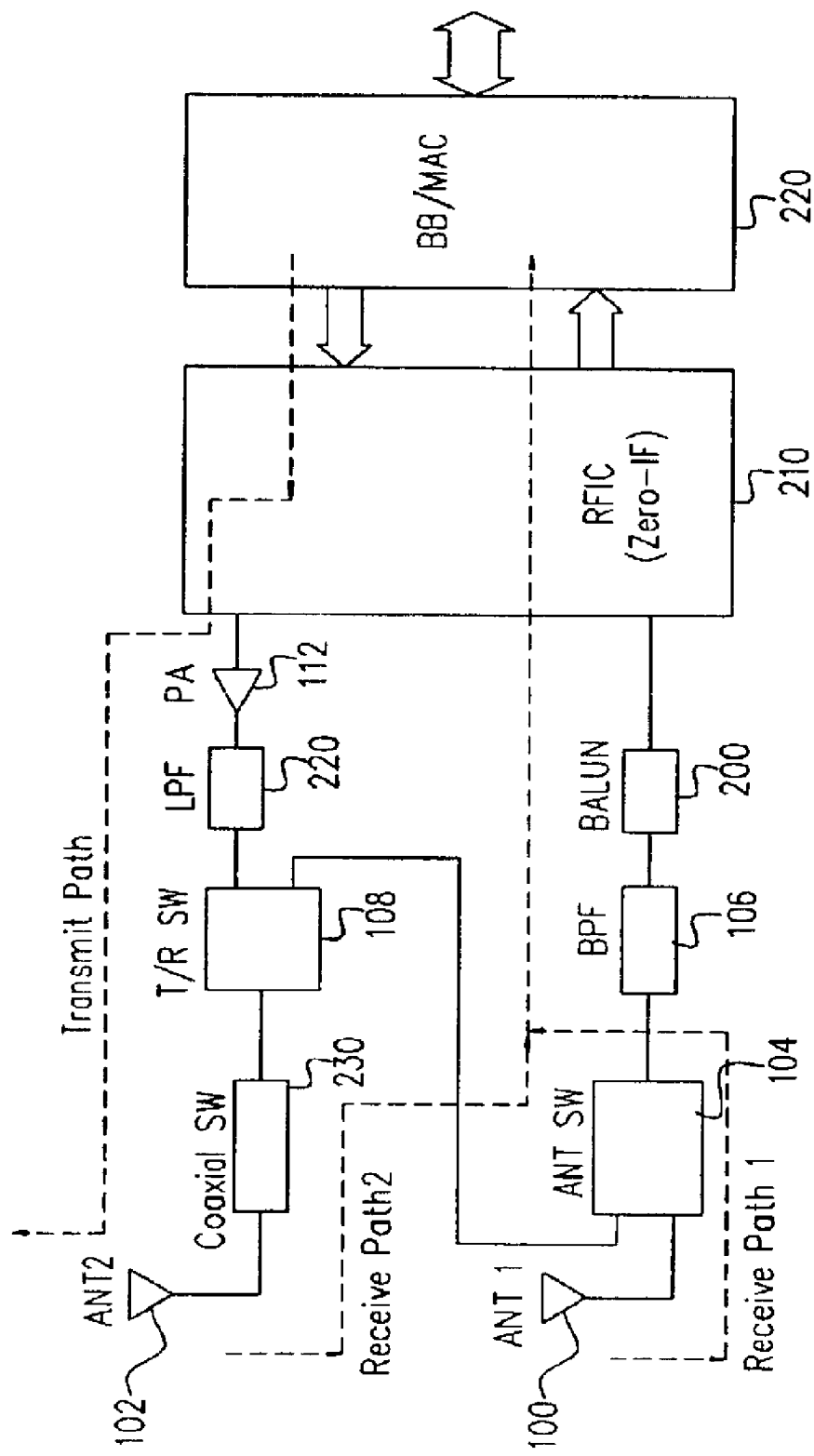
FIG. 2 is a block diagram, schematically illustrating the wireless communication circuit architecture, according to a preferred embodiment of the invention.

FIG. 2 is a block diagram, schematically illustrating the wireless communication circuit architecture, according to a preferred embodiment of the invention. In FIG. 2, even though the individual device elements are similar, due to the novel design of the circuit architecture, the invention has significantly produced some improved results not expected by the prior art. Two antennas 100 and 102 are used in this example for receiving RF signals and one of them is used to transmitting signals. However, the number of antennas is not limited to two. Under the same principle, based on the switching capability, the number of antennas can be greater than two, as a design choice. The design with multiple antennas 100 and 102 is for diversity and can allow the one with the best quality for receiving signal to be chosen. However, for transmitting the RF signal, only one of the multiple antennas is needed. In this manner, in the example, the antenna 102 is, for example, taken for transmitting signal.

For receiving the RF signals in receiving operation mode, there are two paths with respect to the two antennas 100, 102. The antennas 100, 102 are coupled to the antenna switch 104 as indicated by the receiving path 1 and receiving path 2. Since the antenna 102 is also used for transmitting signal, the antenna 102 is not directly coupled to the antenna switch 104 but is arranged to go through a transmission/receiving switch 230 for selection. The further relation will be described later. Then, the antenna switch 104 selects the better one of RF signals in receiving quality, and the output signal is sent to a filter unit 106. The raw receiving signal usually includes low and high frequency noises, which noses are necessary to be filter away, so as to suppress the undesired interference signals. The filter unit 106 usually includes a band pass filter (BPF). After the BPF 106, the signal is sent to a RFIC 210. Since the RFIC 210 needs the differential signal, a BALUM circuit is, for example, used to convert the signal and also make the signal to be matched with the RFIC 210 in input impedance. The RFIC 210 preferably can include, for example, a type of zero-IF. Here, the zero-IF means that there is no a VCO operated in the intermediate frequency (IF). The use of RFIC with zero-IF design can also produce some improvement according to the present invention and the features are to be also described later. The RFIC 210 process the signal, so as to obtain the content carried by the received signal, and then the processed signal is input to a BB/MAC 220. The BB/MAC 220 is an interfacing unit to communicate inwardly with the local system, which can be, for example, a computer system.

In the forgoing design, since the RFIC 210 has a low noise amplifier (LNA) inside, the BPF 106 is necessary to suppress the unwanted interference signals. Also and, the BALUN differentially divides the RF signal for receiving by RFIC 210. The BALUN circuit is well matched to the input impedance of LNA block to reduce the noise figure. The RFIC directly down-converts the RF signal into baseband I/Q signal without any SAW filter.

Figure 1:
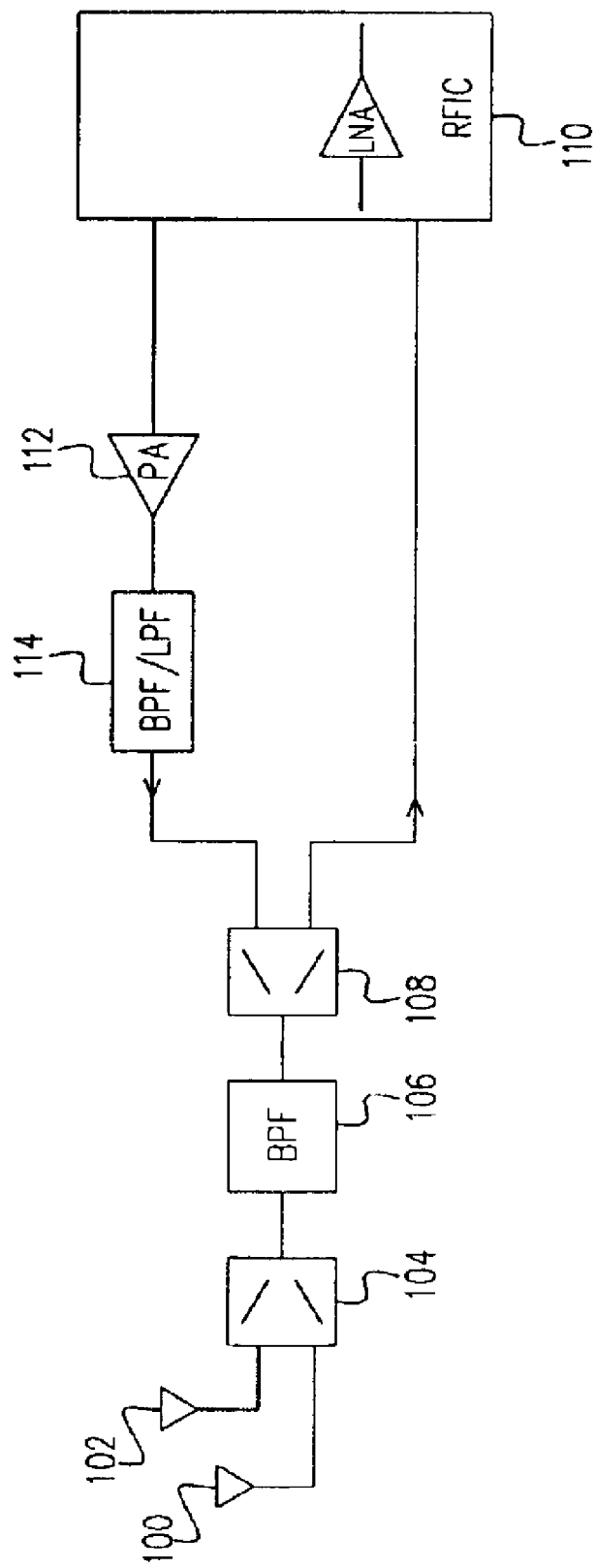
FIG. 1 is a block diagram, schematically illustrating the conventional wireless communication circuit architecture.

From the consideration of insertion loss, typically, the antenna switch 104 consumes 0.5 dB. The BPF 106 consumes about 2.0 dB to 2.4 dB. For receiving path 2, it additionally includes the T/R switch 108, which also consumes about 0.5 dB. This different from the conventional design in FIG. 1 because the two antenna 100 and 102 always have to pass the T/R switch 108. The receiving sensitivity for the antenna 100 in the invention is improved.

For the transmission path in the transmission operation mode, it follows the dashed line from the BB/MAC 220 to the antenna 102. When data signal from the BB/MAC 220 is processed by the RFIC 210 into the transmitting RF signal, the transmitting signal is amplified by the power amplifier (PA) 112. The amplified signal is then input to the filter unit 220. The filter unit 220 can be a combination of BPF and LPF. However, the invention preferably designs the circuit with the zero-IF type REFIC 210, then it has been sufficient for the filter unit 200 to only need the LPF. This is because the zero-IF type REFIC 210 has no the VCO for reducing the frequency to the intermediate frequency. The BPF then is avoided and the insertion loss is reduced. The insertion loss for the LPF usually is less than 1 dB, such as 0.8 dB.

The transmitting signal output from the filter unit 220 then is input to the T/R switch 108. As previously mentioned, since the antenna 102 is assigned to serve as the transmitting antenna also, the T/R switch 108 is used to select the state for transmitting or receiving. The antenna 102 then is coupled to the T/R switch 230. In addition, if a test is desired, a coaxial switch 230 can be included. However, the coaxial switch 230 is not absolutely necessary.

As the transmitting path introduced by the invention, the BPF 106 in receiving path 1 and path 2 is not shared by the transmitting path. In this design, it only needs one filter unit 220. The insertion loss from the BPF can be avoided. Further still, since the RFIC unit 210 is designed with the zero-IF type. It has been sufficient that the filter unit 220 can only use the LPF. This further reduces the insertion loss. Therefore, the circuit of the invention can have significantly larger transmitting range under a fixed power.

Figure 3:
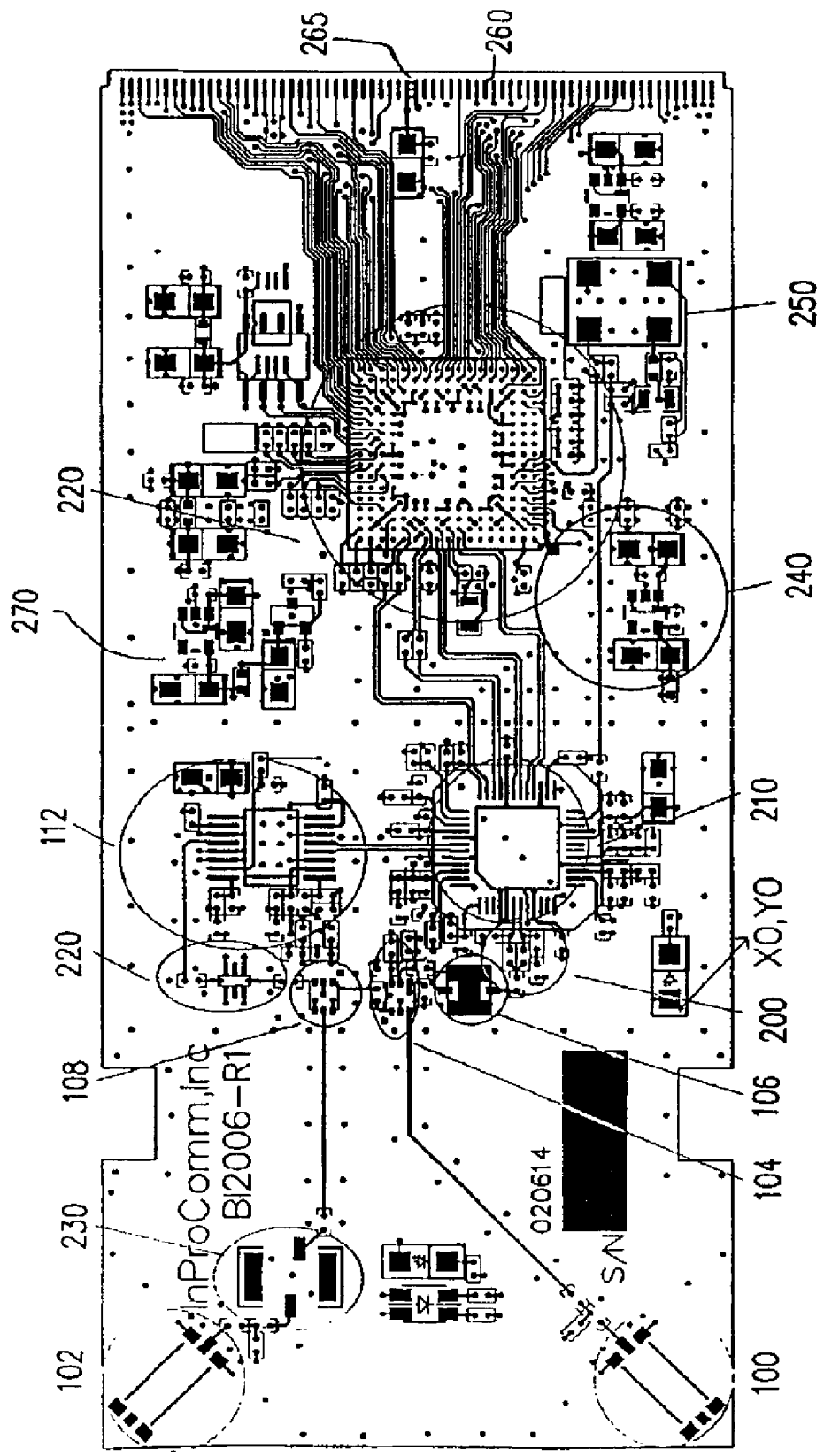
FIG. 3 is a top view, schematically illustrating a layout of the wireless communication circuit on a printed circuit board.
Figure 4:
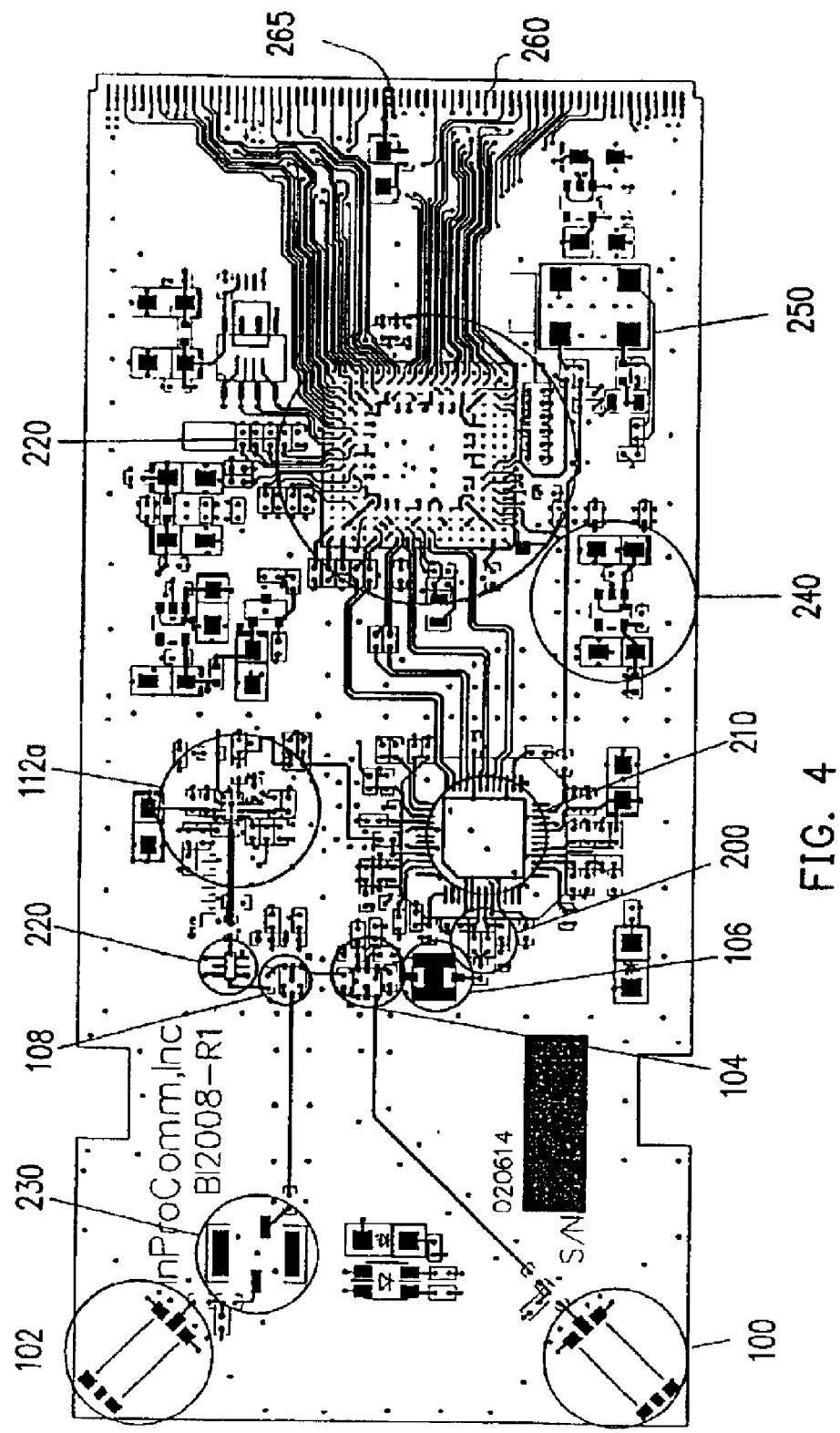
FIG. 4 is a top view, schematically illustrating a layout of another wireless communication circuit on a printed circuit board.

According to the circuit architecture, the circuit can be layout on a print circuit board (PCB). When the circuit is transferred into the PCB, the interconnecting wires and the associated electronic elements, such as resistor or capacitors may have, for example, the electromagnetic interference (EMI). Under the consideration of the EMI compliance, one actual PCB with the wireless communication circuit in FIG. 2 with the peripheral components is shown in FIG. 3. The antenna 100 and antenna 102 are orthogonal placed to uniform the receive pattern at diversity. The BALUN circuit is placed as layout diagram to optimize the noise figure. The PA 112 available in the market can be, for example, Philips SA2411 and Maxim MAX2242. In FIG. 3, the PA 112 is taking the SA2411. In FIG. 4, the PA 112 is taking the MAX2242. The other components are similar.

The detailed layout is as follows. In FIG. 3, the layout is based on the circuit in FIG. 2. Referring to FIG. 2 and FIG. 3, the layout of the wireless communication circuit is designed on a PCB. The PCB is a rectangular board has a first side, a second side, a third side, and a fourth side in counterclockwise. The first and the third sides are shorter than the second and the fourth sides, and the first side is a Y-axis and the second side is an X-axis. The layout includes several components at a preferred locations, so as to reduce the EMI.

The antenna 100 is located at a corner between the first side and the second side. The antenna switch 104 is coupled with the antenna 100 and located at about a middle y-coordinate and a first x-coordinate. The first filter 106 is coupled with the antenna switch 104 and is located under the antenna switch at a smaller y-coordinate. The RF integrated circuit (RFIC) 210 is coupled with the first filter 106, and located at a larger x-coordinate than the first filter, wherein a sensitive input/output side of the RFIC is toward the second side of the PCB. This arrangement is to have longer distance with the power amplifier 112 since the power amplifier and the RFIC has strong interference effect.

A first regulator 240 is located near the second side of the PCB and at a higher X-coordinate than the RFIC. The regulator 240 usually provides the power to the RFIC. A baseband/media-access-control (BB/MAC) 220 is coupled with the RFIC 210, and located at about a middle y-coordinate and a higher x-coordinate than the first regulator. A global oscillator is located about a corner between the second side and the third side. Since the oscillator 250 usually produce a large stable noise, it is preferred to be located near the I/O pins 260, which are to be, for example, plugged into the local computer system. A plurality of signal pins 260 are distributed along the third side of the PCB. The layout of the receiving path now accomplished. However, the consideration of layout of the receiving path has already included the consideration of the transmitting path.

For the transmitting path, a second regulator 270 is located near the fourth side and having about the same x-coordinate of the first regulator. The regulator 270 is also to, for example, provide the power for the power amplifier 220. The power flowing from a positive electrode and returning to the negative electrode is like a loop, which may produce an electromagnetic effect. The power pair 265, the BB/MAC and the regulator 240 naturally form a loop. Likewise, the power pair 265, the BB/MAC and the regulator 270 naturally form another loop. A crossing of the two loops should be avoided. In this layout of the invention, the crossing does not occur.

The power amplifier 112 is coupled to the RFIC 210, and located near the fourth side and about with the same x-coordinate of the RFIC, wherein the distance between the power amplifier 112 and the RFIC 210 is set to have sufficient large to avoid the interference. The filter 220 is coupled to the power amplifier 112 and located at a smaller x-coordinate and near the fourth side. The T/R switch 108 is coupled to the filter 220, and located at a lower y-coordinate than the second filter and about the same x-coordinate, wherein the T/R switch 108 and the antenna switch 104 are also coupled. The second antenna 102 is coupled to the T/R switch 108, and located at a corner between the first side and the fourth side.

Likewise, the layout in FIG. 4 is similar to the layout in FIG. 3 except the type of power amplifier 112 and 112a. The factors to be considered are the same.

In the forgoing layout, the RFIC 210 and the power amplifier 112 have sufficient distance to avoid the interference but still remain in compact space. The regulators 240 and 270 separately associate with the power pins 265 of the signal pins 260 to form two loops, which do not cross each other and the loop size remains small. The electromagnetic interference can be further reduced. The oscillator 250, which usually produce a strong noise, is disposed at the corner near the signal pins 260, so as to reduce the noise from the oscillator. The PCB implemented with the layout of the circuit structure of FIG. 2 has been optimized when the consideration of EMI between components and the size of the PCB are taken.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A layout of a wireless communication circuit on a printed circuit board (PCB), which is a rectangular board having a first side, a second side, a third side, and a fourth side in counterclockwise, wherein the first and the third sides are shorter than the second and the fourth sides, the first side is a Y-axis and the second side is an X-axis, the layout comprising:

a first antenna, located at a corner between the first side and the second side;

an antenna switch, coupled with the first antenna, and located at about a middle y-coordinate and a first x-coordinate;

a first filter, coupled with the antenna switch, located under the antenna switch at a smaller y-coordinate;

a RF integrated circuit (RFIC), coupled with the first filter, and located at a larger x-coordinate than the first filter, wherein a sensitive input/output side of the RFIC is toward the second side of the PCB;

a first regulator, located near the second side of the PCB and at a higher X-coordinate than the RFIC;

a baseband/media access control (MAC), coupled with the RFIC, and located at about a middle y-coordinate and a higher x-coordinate than the first regulator;

a global oscillator, located about a corner between the second side and the third side;

a plurality of signal pins distributed along the third side of the PCB;

a second regulator, located near the fourth side and having about the same x-coordinate of the first regulator;

a power amplifier, coupled to the RFIC, located near the fourth side and about with the same x-coordinate of the RFIC, wherein the distance between the power amplifier and the RFIC is set to have sufficient value;

a second filter, coupled to the power amplifier, located at a smaller x-coordinate and near the fourth side;

a transmitting/receiving (T/R) switch, coupled to the second filter, and located at a lower y-coordinate than the second filter and about the same x-coordinate, wherein the T/R switch and the antenna switch are also coupled; and a second antenna, coupled to the T/R switch, located at a corner between the first side and the fourth side.

2. The layout of claim 1, wherein the first filter includes a band pass filter (BPF).

3. The layout of claim 1, wherein the second filter includes only a low pass filter (LPF).

4. The layout of claim 1, wherein the RFIC include a zero-IF RFIC.

5. The layout of claim 1, wherein a first loop by a pair of power pins of the signal pins and the first regulator is formed, and a second loop by the pair of power pins of the signal pins and the second regulator is formed, wherein the first loop and the second loop do not cross each other.

* * * * *